(12) United States Patent
Yuan et al.

(10) Patent No.: US 8,802,574 B2
(45) Date of Patent: Aug. 12, 2014

(54) METHODS OF MAKING JOGGED LAYOUT ROUTINGS DOUBLE PATTERNING COMPLIANT

(75) Inventors: Lei Yuan, Sunnyvale, CA (US); Jongwook Kye, Pleasanton, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 91 days.

(21) Appl. No.: 13/418,895

(22) Filed: Mar. 13, 2012

(65) Prior Publication Data
US 2013/0244427 A1    Sep. 19, 2013

(51) Int. Cl.
*H01L 21/302*    (2006.01)

(52) U.S. Cl.
USPC ............. 438/736; 438/717; 438/737; 216/47; 430/312

(58) Field of Classification Search
CPC ............ H01L 21/31144; H01L 21/312; H01L 21/3018; G03F 7/094; G03F 7/095; G03F 7/0035
USPC ................. 438/717, 725, 734, 736, 700, 737; 430/312, 313, 323, 324; 216/47, 48, 49
See application file for complete search history.

(56) References Cited

U.S. PATENT DOCUMENTS

| | | |
|---|---|---|
| 7,913,197 B1 | 3/2011 | Kruger et al. |
| 7,927,928 B2 | 4/2011 | Pierrat |
| 8,026,179 B2 * | 9/2011 | Lue ................................ 438/703 |
| 8,119,310 B1 | 2/2012 | Lu et al. |
| 8,132,128 B2 | 3/2012 | Song et al. |
| 2005/0088633 A1 * | 4/2005 | Borodovsky ..................... 355/18 |
| 2009/0061362 A1 | 3/2009 | Taoka et al. |
| 2010/0086877 A1 * | 4/2010 | Soma et al. .................... 430/323 |
| 2010/0178773 A1 * | 7/2010 | Oh et al. ........................ 438/703 |
| 2010/0193917 A1 * | 8/2010 | Olson ............................ 257/618 |
| 2010/0196803 A1 | 8/2010 | Lu et al. |
| 2011/0012237 A1 | 1/2011 | Pierrat |
| 2011/0023002 A1 | 1/2011 | Cheng et al. |
| 2011/0033803 A1 * | 2/2011 | Hatakeyama et al. ...... 430/285.1 |
| 2011/0078638 A1 | 3/2011 | Kahng et al. |
| 2011/0096600 A1 * | 4/2011 | Noguchi ................... 365/185.05 |
| 2011/0119648 A1 | 5/2011 | Chen et al. |
| 2011/0296360 A1 | 12/2011 | Wang et al. |
| 2012/0052422 A1 | 3/2012 | Lu et al. |
| 2012/0054696 A1 | 3/2012 | Su et al. |
| 2012/0072875 A1 | 3/2012 | Ghosh et al. |
| 2012/0135341 A1 | 5/2012 | Tseng |
| 2012/0137261 A1 | 5/2012 | Ban et al. |

* cited by examiner

*Primary Examiner* — Lan Vinh
(74) *Attorney, Agent, or Firm* — Amerson Law Firm, PLLC

(57) ABSTRACT

One illustrative method disclosed herein involves creating an overall target pattern that includes an odd-jogged feature with a crossover region that connects first and second line portions, wherein the crossover region has a first dimension in a first direction that is greater than a second dimension that is transverse to the first direction, decomposing the overall target pattern into a first sub-target pattern and a second sub-target pattern, wherein each of the sub-target patterns comprise a line portion and a first portion of the crossover region, and generating first and second sets of mask data corresponding to the first and second sub-target patterns, respectively.

12 Claims, 5 Drawing Sheets

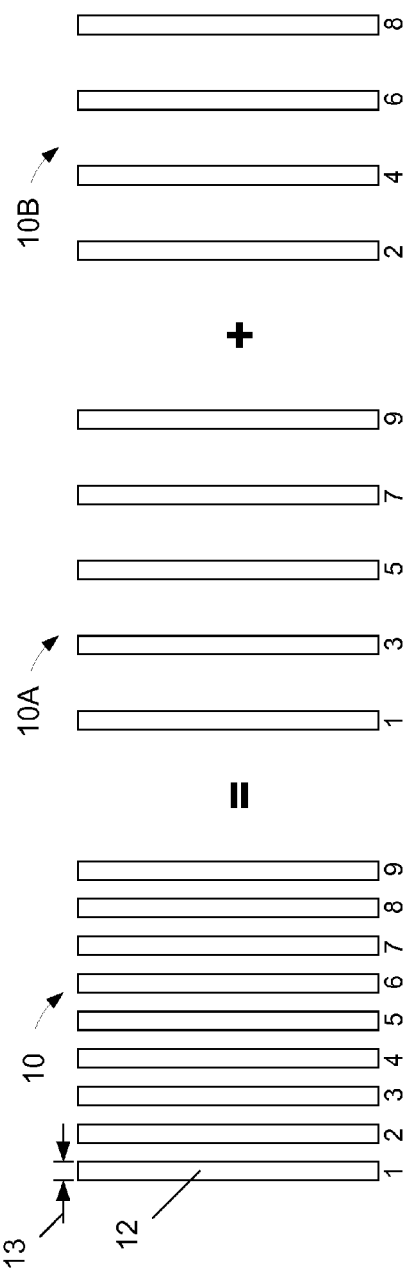
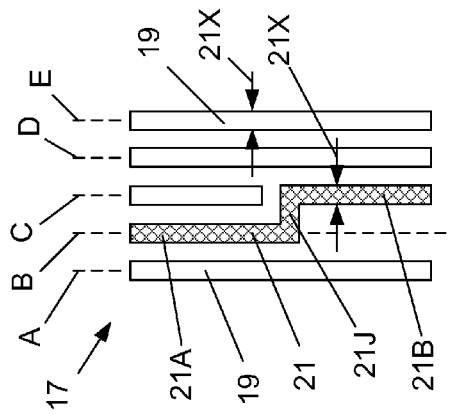
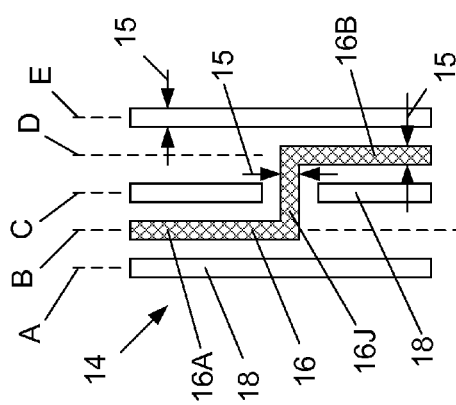
Figure 1 (Prior Art)
Figure 2A (Prior Art)
Figure 2B (Prior Art)

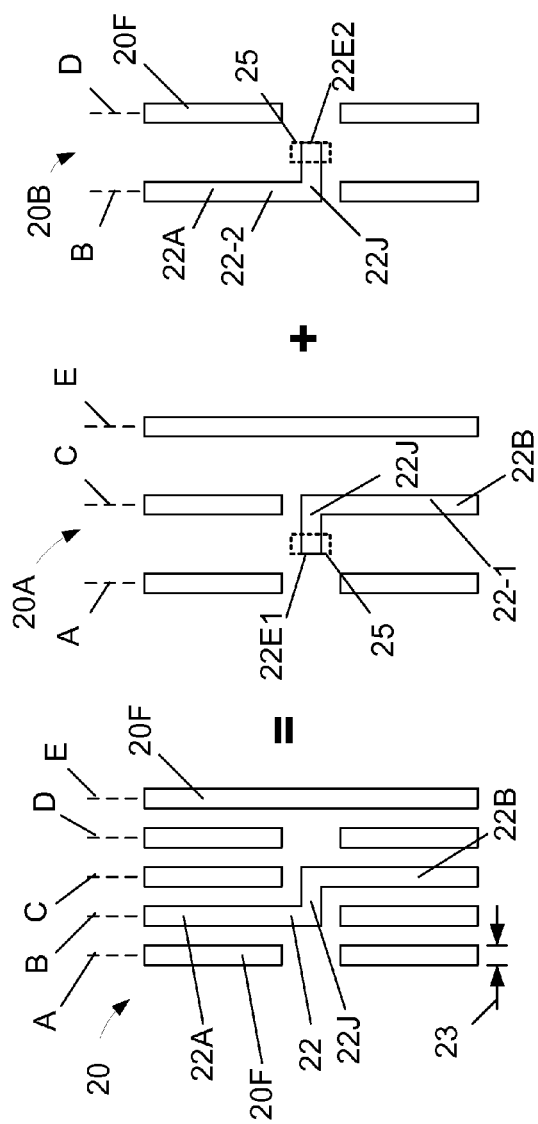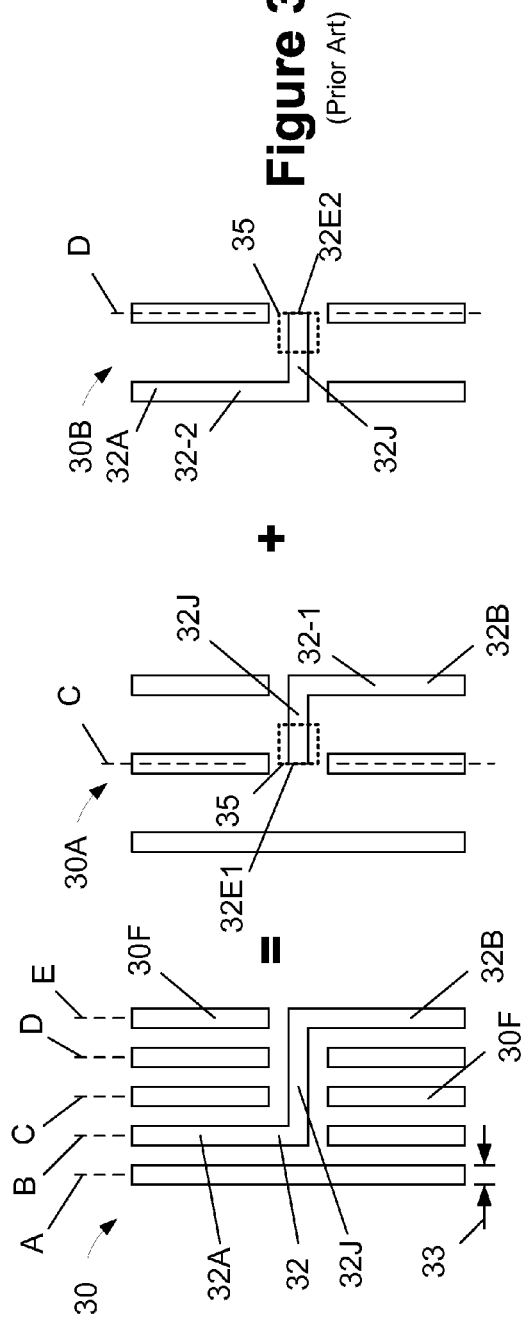

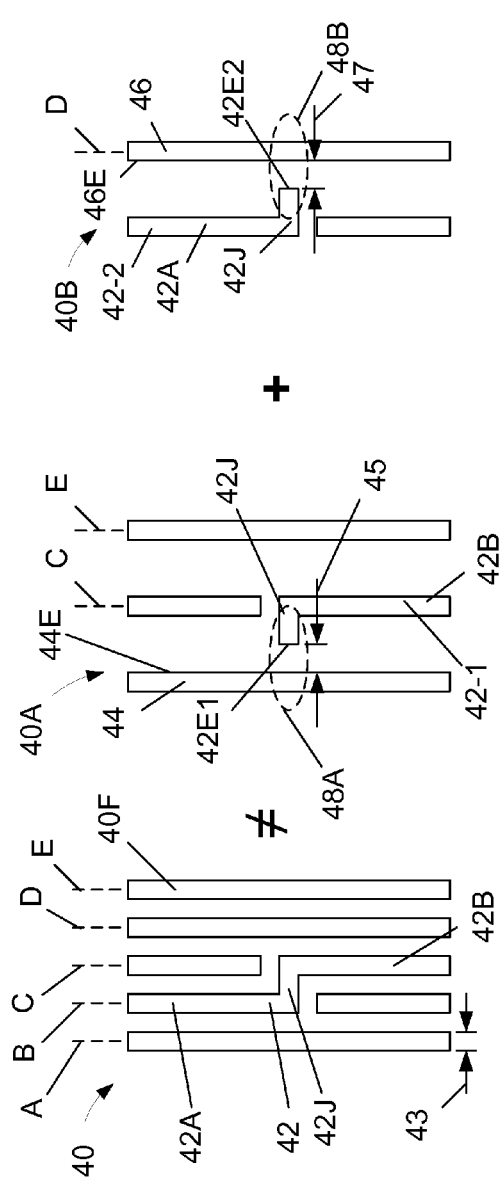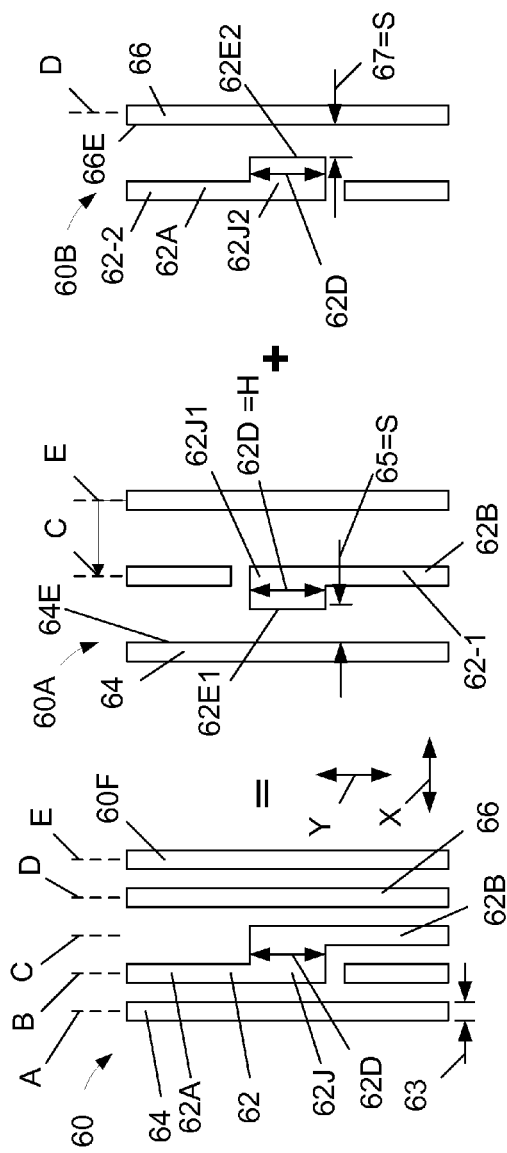

US 8,802,574 B2

METHODS OF MAKING JOGGED LAYOUT ROUTINGS DOUBLE PATTERNING COMPLIANT

BACKGROUND OF THE INVENTION

1. Field of the Invention

Generally, the present disclosure relates to the manufacture of sophisticated semiconductor devices, and, more specifically, to various methods of making jogged routing layouts that are compliant with double patterning techniques and resulting semiconductor devices that contain such jogged routing layouts.

2. Description of the Related Art

Photolithography is one of the basic processes used in manufacturing integrated circuit products. At a very high level, photolithography involves: (1) forming a layer of light or radiation-sensitive material, such as photoresist, above a layer of material or a substrate; (2) selectively exposing the radiation-sensitive material to a light generated by a light source (such as a DUV or EUV source) to transfer a pattern defined by a mask or reticle (interchangeable terms as used herein) to the radiation-sensitive material; and (3) developing the exposed layer of radiation-sensitive material to define a patterned mask layer. Various process operations, such as etching or ion implantation processes, may then be performed on the underlying layer of material or substrate through the patterned mask layer.

Of course, the ultimate goal in integrated circuit fabrication is to faithfully reproduce the original circuit design on the integrated circuit product. Historically, the feature sizes and pitches (spacing between features) employed in integrated circuit products were such that a desired pattern could be formed using a single patterned photoresist masking layer. However, in recent years, device dimensions and pitches have been reduced to the point where existing photolithography tools, e.g., 193 nm wavelength photolithography tools, cannot form a single patterned mask layer with all of the features of the overall target pattern. Accordingly, device designers have resorted to techniques that involve performing multiple exposures to define a single target pattern in a layer of material. One such technique is generally referred to as double patterning. In general, double patterning is an exposure method that involves splitting (i.e., dividing or separating) a dense overall target circuit pattern into two separate, less-dense patterns. The simplified, less-dense patterns are then printed separately on a wafer utilizing two separate masks (where one of the masks is utilized to image one of the less-dense patterns, and the other mask is utilized to image the other less-dense pattern). Further, in some cases, the second pattern is printed in between the lines of the first pattern such that the imaged wafer has, for example, a feature pitch which is half that found on either of the two less-dense masks. This technique effectively lowers the complexity of the photolithography process, improving the achievable resolution and enabling the printing of far smaller features than would otherwise be possible using existing photolithography tools.

FIG. 1 depicts one illustrative double patterning process. An initial overall target pattern 10 that is comprised of nine illustrative trench features 12 is depicted in FIG. 1. Each of the features 12 has the same critical dimension 13. The space between the features 12 in the initial overall target pattern 10 is such that the initial overall target pattern 10 cannot be printed using a single mask with available photolithography tools. Thus, in this illustrative example, the initial overall target pattern 10 is decomposed into a first sub-target pattern 10A (comprised of features 1, 3, 5, 7 and 9), and a second sub-target pattern 10B (comprised of the features 2, 4, 6 and 8). The sub-target patterns 10A, 10B are referred to as "sub-target patterns" because each of them contain less than all of the features in the initial overall target pattern 10. The features that are incorporated in the sub-target patterns 10A, 10B are selected and spaced such that the patterns 10A, 10B may be readily formed in a single masking layer using available photolithography tools. Ultimately, when the mask design process is completed, data corresponding to the sub-target patterns 10A, 10B (modified as necessary during the design process) will be provided to a mask manufacturer that will produce tangible masks (not shown) corresponding to the patterns 10A, 10B to be used in a photolithography tool to manufacture integrated circuit products.

FIGS. 2A-2B depict various illustrative circuit layout patterns that may be employed when designing integrated circuit devices. FIG. 2A depicts an illustrative circuit layout pattern 14 comprised of a plurality of rectangular line-type features 18, e.g., trenches, and a crossover or jogged feature 16. The crossover or jogged feature 16 is a composite pattern that is comprised of line-type features 16A, 16B that are connected together by a crossover portion 16J. All of the features depicted in FIG. 2A, including the crossover portion 16J, have the same critical dimension 15. The pattern 14 includes five illustrative routing tracks (A-E). The distance between adjacent routing tracks may be referred to as the "pitch" of features in the pattern 14. The crossover feature 16 depicted in FIG. 2A is sometimes referred to as an "even-jog" type feature because the crossover portion 16J spans an even number of pitch distances, e.g., a fist "pitch" between the tracks B and C and a "second pitch" between tracks C and D in the depicted example. A crossover type feature that spanned 6 such pitch distances (not shown) would also be referred to as an even-jog type feature. In contrast, the features 12 depicted in the pattern 10 in FIG. 1 do not have any such crossover or jogged features.

FIG. 2B depicts an illustrative circuit layout pattern 17 comprised of a plurality of rectangular line-type features 19, e.g., trenches, and a crossover or jogged feature 21. The pattern 15 also includes five illustrative routing tracks (A-E). The crossover feature 21 is a composite pattern that is comprised of line-type features 21A, 21B that are connected together by a crossover portion 21J. All of the features depicted in FIG. 2B, including the crossover portion 21J, have the same critical dimension 21X. The crossover feature 21 is sometimes referred to as an "odd-jog" type feature because the crossover portion 21J spans a distance equal to one pitch, e.g., the distance between the tracks B and C in the depicted example.

To use double patterning techniques, an overall target pattern must be what is referred to as double patterning compliant. In general, this means that an overall target pattern can be decomposed into two separate patterns that each may be printed in a single layer using existing photolithography tools. An overall target pattern may have many regions or areas that cannot be printed because the features in those regions are spaced too close to one another for existing photolithography tools to be able to print such closely spaced features as individual features. To the extent an overall target pattern has an even number of such regions, such a pattern is sometimes referred to as an "even cycle" pattern, while an overall target pattern that has an odd number of such regions is sometimes referred to as an "odd cycle" pattern. Even cycle patterns can be formed using double patterning techniques, while odd cycle patterns cannot be formed using double patterning techniques.

In general, the use of patterns that have odd jog crossover or jogged features, such as the feature 21 depicted in FIG. 2B, is discouraged when trying to develop circuit layouts that are intended to be double patterning compliant for fear that the inclusion of such odd-jog crossover features will lead to odd-cycle routing layouts. However, the general restriction against using such odd-jog features for double patterning compliant circuit layouts degrade routing efficiency and may lead to the consumption of additional chip area as circuit layouts are increased in size as a result of the non-use of such odd-jog features.

FIGS. 3A-3C depict additional overall target patterns that are discussed as it relates to various issues associated with double patterning techniques. FIG. 3A depicts an illustrative circuit layout pattern 20 comprised of a plurality of rectangular line-type features 20F, e.g., trenches, and a crossover or jogged feature 22. The pattern 20 includes five illustrative routing tracks (A-E). The crossover feature 22 is a composite pattern that is comprised of line-type features 22A, 22B that are connected together by a crossover portion 22J. All of the features depicted in FIG. 2A, including the crossover portion 22J, have the same critical dimension 23. The crossover feature 22J depicted in FIG. 3A is an odd-jog type feature because the crossover portion 16J spans a distance equal to one pitch, e.g., between the tracks B and C in the depicted example. In one illustrative example, as depicted in FIG. 3A, the overall target pattern 20 may be decomposed into two sub-target patterns 20A, 20B. In this example, the crossover feature 22 is divided into two sub-features 22-1 (in pattern 20A) and 22-2 (in pattern 20B). The two sub-features 22-1, 22-2 are sized such that when these patterns are formed on a product, there will be an area or overlap 25—or a so-called "stich"—that will be printed twice, once when the mask corresponding to the pattern 20A is used and a second time when the mask corresponding to the pattern 20B is used. In this example, even though crossover or jogged feature 22 is an odd-jog feature, the pattern 20 may be formed using double patterning techniques because there is no structure near or opposite the ends 22E1 and 22E2 of the sub-features 22-1, 22-2, respectively.

FIG. 3B depicts an illustrative circuit layout pattern 30 comprised of a plurality of rectangular line-type features 30F, e.g., trenches, and a crossover or jogged feature 32. The pattern 30 includes five illustrative routing tracks (A-E). The crossover feature 32 is a composite pattern that is comprised of line-type features 32A, 32B that are connected together by a crossover portion 32J. All of the features depicted in FIG. 3B, including the crossover portion 32J, have the same critical dimension 33. The crossover feature 32 depicted in FIG. 3B is sometimes referred to as an odd-jog type feature because the crossover portion 32J spans a distance equal to three pitches, e.g., between the tracks B and E in the depicted example. In one illustrative example, as depicted in FIG. 3B, the overall target pattern 30 may be decomposed into two sub-target patterns 30A, 30B. In this example, the crossover feature 32 is divided into two sub-features 32-1 (in pattern 30A) and 32-2 (in pattern 30B). The two sub-features 32-1, 32-2 are sized such that, when these patterns are formed on a product, there will be an area or overlap 35—or a so-called "stich"— that will be printed twice, once when the mask corresponding to the pattern 30A is used and a second time when the mask corresponding to the pattern 30B is used. In this example, even though crossover or jogged feature 32 is an "odd-jog" feature, the pattern 30 may be formed using double patterning techniques because there is no structure near or opposite the ends 32E1, and 32E2 of the sub-features 32-1, 32-2, respectively.

FIG. 3C depicts an illustrative circuit layout pattern 40 comprised of a plurality of rectangular line-type features 40F, e.g., trenches, and a crossover or jogged feature 42. The pattern 40 also includes five illustrative routing tracks (A-E). The crossover feature 42 is a composite pattern that is comprised of line-type features 42A, 42B that are connected together by a crossover portion 42J. All of the features depicted in FIG. 3C, including the crossover portion 42J, have the same critical dimension 43. The crossover feature 42 depicted in FIG. 3C is sometimes referred to as an odd-jog type feature because the crossover portion 42J spans a distance equal to one pitch, e.g., between the tracks B and C in the depicted example. In this example, the overall target pattern 40 may be initially decomposed into two sub-target patterns 40A, 40B. In this example, the crossover feature 42 is divided into two sub-features 42-1 (in pattern 40A) and 42-2 (in pattern 40B). However, in this example, the overall pattern 40 cannot be formed using double patterning techniques because there is structure near or opposite the ends 42E1 and 42E2 of the sub-features 42-1, 42-2, in the areas indicated by the dashed lines 48A, 48B. That is, the spacing 45, 47 between the ends 42E1, 42E2, respectively, and the nearby structure 44, 46, respectively, violates minimum spacing design rules and, accordingly, the patterns 40A, 40B cannot be reliably formed using photolithography tools that will be used manufacturing such a pattern. Additionally, when printing certain features, the surrounding structures can and do have an impact on how accurately a feature may be formed. For example, it is known that, when trying to form a pattern like that depicted in FIG. 3C, where, for example, the end 42E1 is positioned adjacent the line 44, there will be greater variation in printing the feature 42-1 in the situation where there was an open space opposite the end 42E1. Accordingly, the overall pattern 40 depicted in FIG. 3C cannot be formed using double patterning techniques. The overall target pattern must be redesigned and/or re-routed, which results in extra time and expense and perhaps the consumption of additional area on a semiconductor chip.

The present disclosure is directed to various methods of making jogged routing layouts that are compliant with double patterning techniques which may solve or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of making jogged routing layouts that are compliant with double patterning techniques and resulting semiconductor devices that contain such jogged routing layouts. In one embodiment, a method is disclosed herein that is directed to the design and manufacture of reticles that may be employed in semiconductor manufacturing. Such a method involves creating an overall target pattern comprised of a plurality of features that includes at least one odd-jogged feature, wherein the odd-jogged feature has a crossover region that connects first and second line portions. In this example, the crossover region has a first dimension in a first direction (the Y-direction) that is greater than a second dimension (i.e., critical dimension) of each of the first and second line portions in a second direction (the X-direction that is transverse to the Y-direction). The method further includes the steps of decomposing the overall target pattern into a first sub-target pattern and a second sub-target pattern, wherein the first sub-target pattern comprises one of the line portions and a first portion of the crossover region and wherein the second sub-target pattern comprises the other of the line portions and a second portion of the crossover region, generating a first set of mask data corresponding to the first sub-target pattern, and generating a second set of mask data corresponding to the second sub-target pattern. In some embodiments, the method further includes the steps of sending the first and second sets of mask data to a mask manufacturer to fabricate a first mask that corresponds to the first sub-target pattern and to fabricate a second mask that corresponds to the second sub-target pattern.

In further more detailed embodiments, the various methods disclosed herein include determining a value for the first dimension of the crossover region at a point where a minimum spacing between features in the first sub-target pattern is equal to or larger than a minimum resolution capability of single patterning technology. The various methods disclosed herein may also include determining a value for an overlay distance between the jogged portions of the first and second sub-patterns at a point where a minimum spacing between the features in the first sub-target pattern is equal to or larger than a minimum resolution capability of single patterning technology.

In another example, one illustrative method disclosed herein involves transferring an overall target pattern to a layer of material, wherein the overall target pattern includes an odd-jogged feature and wherein the overall target pattern is comprised of first and second sub-target patterns. Such a method may involve performing a first etching process through a first mask layer having the first sub-target pattern defined therein to transfer the first sub-target pattern to the layer of material, wherein the first sub-target pattern is comprised of one of the first and second line portions and a first portion of the crossover region of the odd-jogged feature, and performing a second etching process through a second mask layer having the second sub-target pattern defined therein to transfer the second sub-target pattern to the layer of material, wherein the second sub-target pattern comprises the other of the first and second line portions and a second portion of the crossover region of the odd-jogged feature. In a further example, the layer of material having the first and second sub-target patterns defined therein may then be used to transfer the overall target pattern to an underlying layer of material or to a semiconducting substrate.

BRIEF DESCRIPTION OF THE DRAWINGS

The disclosure may be understood by reference to the following description taken in conjunction with the accompanying drawings, in which like reference numerals identify like elements, and in which:

FIG. 1 is a simplistic depiction of an illustrative prior art double patterning process;

FIGS. 2A-2B depict various illustrative prior art circuit layouts involving jogged features;

FIGS. 3A-3C depict illustrative prior art routing layouts;

FIGS. 4A-4C depict various illustrative embodiments of various method disclosed herein of making jogged routing layouts that are compliant with double patterning techniques.

Figure 4B:
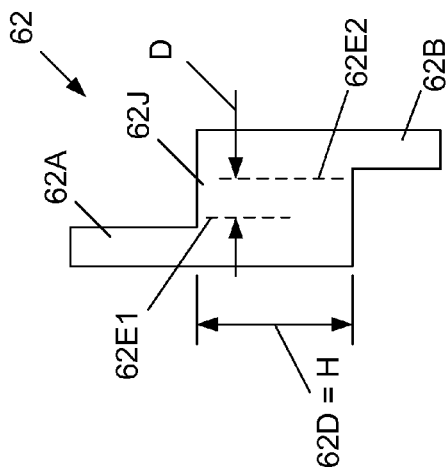

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of making jogged routing layouts that are compliant with double patterning techniques and resulting semiconductor devices that contain such jogged routing layouts. As will be readily apparent to those skilled in the art upon a complete reading of the present application, the methods and devices disclosed herein may be employed in the fabrication of a variety of devices, such as logic devices, memory devices, ASICs, etc. With reference to the attached figures, various illustrative embodiments of the methods and devices disclosed herein will now be described in more detail.

Figure 4C:
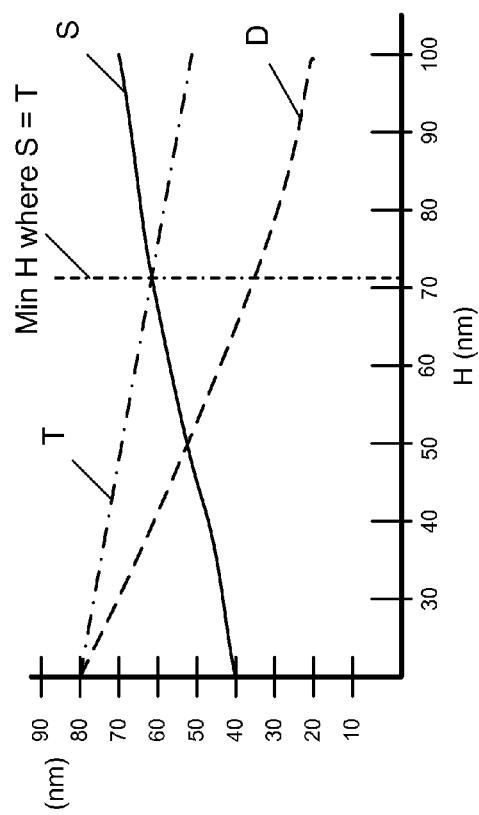

Certain aspects of the present subject matter will now be described with reference to FIGS. 4A-4C. FIG. 4A depicts an illustrative circuit layout pattern 60 comprised of a plurality of rectangular line-type features 60F, e.g., trenches, lines, etc., and a crossover or jogged feature 62. The pattern 60 includes five illustrative routing tracks (A-E). The crossover feature 62 is a composite pattern that is comprised of line-type features 62A, 62B that are connected together by a crossover region 62J. All of the features 60F depicted in FIG. 4A, except the crossover region 62J, have the same critical dimension 63 in a direction that is transverse to the long axis of the line-type features 60F (the long axis of the line-type features corresponds with orientation of the routing tracks A-E—hereinafter the "Y-direction" as indicated in FIG. 4A). The crossover region 62J depicted in FIG. 4A is sometimes referred to as an odd-jog type feature because the crossover region 62J spans a distance equal to one pitch, e.g., the distance between the tracks B and C in the depicted example.

Unlike the crossover or jogged portions 22J, 32J and 42J shown in the prior art patterns depicted in FIGS. 3A, 3B and 3C, respectively, the crossover region 62J shown in FIG. 4A has a dimension 62D in the Y-direction that is greater than the critical dimension of the line portions 62A, 62B in a direction that is transverse to the Y-direction (hereinafter the "X-direction" as indicated in FIG. 4A). Stated simply, in the depicted example, the dimension 62D is greater than the critical dimension 63 of the line portions 62A, 62B of the jogged feature 62.

In one illustrative example, as depicted in FIG. 4A, the overall target pattern 60 may be decomposed into first and second sub-target patterns 60A, 60B, respectively. In this example, the crossover region 62J is divided into first and second portions 62J1 (in pattern 60A) and 62J2 (in pattern 60B), respectively. FIG. 4B is an enlarged view of the jogged feature 62.

As reflected in these drawings, the first portion 62-1 is comprised of the line-type feature 62B and a first portion 62J1 of the crossover region 62J. In the depicted example, both the first and second portions 62J1, 62J2 of the crossover portion 62J have the same dimension 62D in the Y-direction as does the original jogged portion 62J. By increasing the dimension of the jogged portion 62J, the relationship between the edge 62E1 and the edge 64E of the feature 64 behaves more like edge-to edge when printed. The edge 62E1 of the first portion 62-1 is spaced apart from the edge 64E of the nearest feature 64 in the first sub-target pattern 60A by a distance 65 that is greater than the minimum spacing allowed for the overall target pattern 60. The edge 62E2 of the second portion 62-2 is spaced apart from the edge 66E of the nearest feature 66 in the second sub-target pattern 60B by a distance 67 that is greater than the minimum spacing allowed for the overall target pattern 60. The first and second portions 62J1, 62J2, are sized such that, when these patterns 60A, 60B are formed on a product, there will be an area or overlap "D" (see FIG. 4B) between the edges 62E1 and 62E2.

As indicated above, in the depicted example, both the first and second portions 62J1, 62J2 of the crossover portion 62J have the same dimension 62D in the Y-direction as does the original jogged portion 62J. However, such a configuration is not required in all applications. In some applications, the Y-direction dimension of both of the portions 62J1, 62J2 may be less than the overall Y-direction dimension 62D of the jogged portion 62.

Determining the appropriate Y-direction distance 62D of the jogged portion 62J of the jogged feature 62 will vary depending on the particular application and a variety of factors. FIG. 4C is a graph that depicts at least some of the factors that may be considered in setting the Y-direction dimension 62D—or "H"—of the jogged portion 62J. In FIG. 4C, H is plotted on the horizontal axis, the line "T" represents the smallest space that can be produced using whatever single patterning technology or technique is employed, e.g., DUV lithography, the line "D" represents the overlap of the portions 62J1, 62J2 (see FIG. 4B), and the line "S" represents the spacing (65, 67 shown in FIG. 4A) between various features in the first and second sub-target patterns 60A, 60B. The minimum value of H is where S is approximately equal to T. Of course, if desired, the Y-dimension 62D of the jogged portion 62J may be selected to be greater than the aforementioned minimum value of H if plot space allows or if there are other reasons for doing so. Stated another way, a minimum value of H is determined at a point where the minimum spacing between the features in the first sub-target pattern is approximately equal to or larger than the minimum resolution capability of single patterning technology. Similarly, the amount or magnitude of the overlap D between the jogged portions of the first and second is a value that is determined at a point where a minimum spacing between the features in the first sub-target pattern is approximately equal to or larger than a minimum resolution capability of single patterning technology. Meanwhile, the amount of the overlap D must be sufficient to guarantee the connectivity between the first (62J1) and second (62J2) portion of the jogged portion. The data set forth in FIG. 4C can be generated through lithography modeling or real silicon experiments.

Based on current day technology, the following are numerical examples of the various dimensions described above, for one particular example. In one example, T=64 nm (the minimum spacing or pitch), S=60 nm (the dimensions 65, 67 are the same) and the overlap D=32 nm. In this illustrative example, the minimum value of H is about 70 nm. Of course this is but one numerical example and the various inventions disclosed herein should not be considered to be limited to such an example. Moreover, FIG. 4C is not intended to depict this particular example. Thus, using the methods disclosed herein, even though crossover or jogged feature 62 is an "odd-jog" feature bounded on the left by the line 64 and the right by the line 66 (see FIG. 4A), the pattern 60 may be formed using double patterning techniques by using masks corresponding to the sub-target patterns 60A, 60B.

As noted previously, the methods disclosed herein may be employed to form masks or reticles (the terms are used interchangeably herein) to be used in the manufacture of integrated circuit products. Such masks or reticles generally comprise patterns corresponding to the circuit components that are part of an integrated circuit product. The patterns used to create such masks or reticles are generated utilizing computer-aided design (CAD) programs, wherein this process is sometimes referred to as electronic design automation. Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes.

In addition to the methods described above, other techniques may also be employed to produce more accurate masks. For example, well-known software-based optical proximity correction (OPC) techniques may be performed of the first sub-target pattern 60A and the second sub-target pattern 60B in an effort to generate a more accurate mask that can reliably and repeatedly produce the desired pattern on the target material or structure. There are several OPC correction methods that have been employed within the industry, and they may be roughly classified into rule-based approaches and simulation-based approaches. Both of these techniques may be employed with the methods disclosed herein. Additionally, the masks designed as described herein may also include multiple SRAFs, in an effort to produce a more effective and accurate mask.

Figure 5:
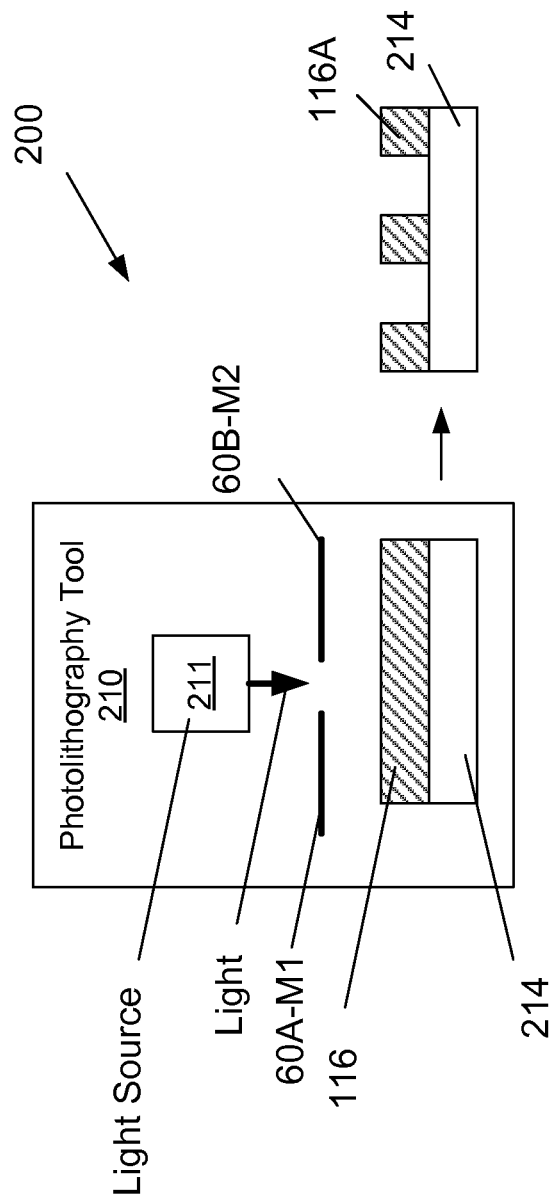
FIG. 5 schematically depicts an illustrative system disclosed herein for exposing a plurality of substrates using reticles designed as disclosed herein and for practicing various methods disclosed herein.

FIG. 5 schematically depicts an illustrative system 200 comprised of an illustrative photolithography tool 210 (having a light source 211), reticles 60A-M1 and 60B-M2 that correspond to the sub-target patterns 60A, 60B, respectively, an illustrative substrate or wafer 214 and the hard mask layer 116 formed above the wafer 214. The reticles 60A-M1 and 60B-M2 are depicted as being positioned side by side in the illustrative photolithography tool 200, but those skilled in the art will recognize that the reticles 60A-M1 and 60B-M2 will be used in a sequential fashion in a double patterning process and they may be used in any order. At least portions of the data to be used in manufacturing the reticles 60A-M1 and 60B-M2 may be generated based on data corresponding to the first sub-target pattern 60A and the second sub-target pattern 60B, respectively, as described above. The data may then be provided to a reticle manufacturer to manufacture the reticles 60A-M1 and 60B-M2. The reticles 60A-M1 and 60B-M2 may then be employed in the photolithography tool 210 (which may be of any desired configuration and employ any desired wavelength or form of radiation) in a sequence of traditional photolithography operations, whereby the overall target pattern 60, defined by the combination of the features in both of the reticles 60A-M1 and 60B-M2, may be transferred to a layer of material, such as the illustrative patterned hard mask layer 116A depicted in FIG. 5. Thereafter, the patterned hard mask layer 116A may be used in fabricating or defining various portions or regions of an integrated circuit product that will be formed in and above the substrate 214. The reticles 60A-M1 and 60B-M2 may be used to form patterned layers of material above subsequently processed wafers as processing continues. Of course, as noted above, the methods disclosed herein may be employed to transfer the overall target pattern 60 to a material layer or a substrate without the need for the hard mask layer 116A depicted in FIG. 5.

In one embodiment, a method is disclosed herein that is directed to the design and manufacture of reticles that may be employed in semiconductor manufacturing. In one example, the method involves creating an overall target pattern 60 comprised of a plurality of features 60F that includes at least one odd-jogged feature 62, wherein the odd-jogged feature 62 has a crossover region 62J that connects first and second line portions 62A, 62B. In this example, the crossover region 62J has a first dimension 62D in a first direction (the Y-direction that is parallel to a long-axis of one the first and second line portions 62A, 62B) that is greater than a second dimension 63 of each of the first and second line portions 62A, 62B in a second direction (the X-direction that is transverse to Y-direction. The method further includes the steps of decomposing the overall target pattern 60 into a first sub-target pattern 60A and a second sub-target pattern 60B, wherein the first sub-target pattern 60A comprises one of the line portions 60A, 60B and a first portion 62J1 of the crossover region 62J and wherein the second sub-target pattern 60B comprises the other of the line portions 60A, 60B, and a second portion 62J2 of the crossover region 62J, generating a first set of mask data corresponding to the first sub-target pattern 60A, and generating a second set of mask data corresponding to the second sub-target pattern 60B. In some embodiments, the method further includes the steps of sending the first and second sets of mask data to a mask manufacturer to fabricate a first mask 60A-M1 that corresponds to the first sub-target pattern 60A and to fabricate a second mask 60B-M2 that corresponds to the second sub-target pattern 60B.

In another example, one illustrative method disclosed herein involves transferring an overall target pattern 60 comprised of first and second sub-target patterns 60A, 60B to a layer of material. Such a method may involve performing a first etching process through a first mask layer having the first sub-target pattern 60A defined therein to transfer the first sub-target pattern 60A to the layer of material, wherein the first sub-target pattern 60A is comprised of one of the first and second line portions 62A, 62B and a first portion 62J1 of the crossover region 62J of the odd-jogged feature 62, and performing a second etching process through a second mask layer having the second sub-target pattern 60B defined therein to transfer the second sub-target pattern 60B to the layer of material, wherein the second sub-target pattern 60B comprises the other of the first and second line portions 62A, 62B and a second portion 62J2 of the crossover region 62J of the odd-jogged feature 62. In a further example, the layer of material having the first and second sub-target patterns 60A, 60B defined therein may then be used to transfer the overall target pattern to an underlying layer of material or to a semiconducting substrate.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    creating an overall target pattern comprised of a plurality of line-type features including an odd-jogged feature, wherein the each of the plurality of features are positioned above separate routing tracks, each of which are separated from an adjacent routing track by a pitch, said odd-jogged feature having a crossover region that connects first and second line portions, wherein said crossover region spans a distance corresponding to an odd number of pitches, said crossover region having a first dimension in a first direction that is parallel to a long-axis of one of said first and second line portions that is greater than a second dimension of each of said first and second line portions in a second direction that is transverse to said first direction;
    decomposing said overall target pattern into a first sub-target pattern and a second sub-target pattern, wherein said first sub-target pattern comprises one of said first and second line portions and a first portion of said crossover region and said second sub-target pattern comprises the other of said first and second line portions and a second portion of said crossover region;
    generating a first set of mask data corresponding to said first sub-target pattern; and
    generating a second set of mask data corresponding to said second sub-target pattern.

2. The method of claim 1, further comprising providing said first and second sets of mask data to a mask manufacturer.

3. The method of claim 1, wherein said odd-jogged feature spans a distance equal to one pitch size of said overall target pattern.

4. The method of claim 1, wherein a first end of said first portion of said crossover region is spaced apart from an edge of a nearest one of said features in said first sub-target pattern by a distance that is greater than 32 nm.

5. The method of claim 4, wherein a second end of said second portion of said crossover region is spaced apart from an edge of a nearest one of said features in said second sub-target pattern by a distance that is greater than 32 nm.

6. The method of claim 1, further comprising determining a value for said first dimension at a point where a minimum spacing between features in said first sub-target pattern is equal to or larger than 32 nm.

7. The method of claim 1, further comprising determining a value for an overlay distance between said jogged portions of said first and second sub-patterns at a point where a minimum spacing between features in said first sub-target pattern is equal to or larger than 32 nm.

8. A method, comprising:
creating an overall target pattern comprised of a plurality of features including an odd-jogged feature, wherein the each of the plurality of features are positioned above separate routing tracks, each of which are separated from an adjacent routing track by a pitch, said odd-jogged feature having a crossover region that connects first and second line portions, wherein said crossover region spans a distance corresponding to an odd number of pitches, said crossover region having a first dimension in a first direction that is parallel to a long-axis of one of said first and second line portions;
decomposing said overall target pattern into a first sub-target pattern and a second sub-target pattern, wherein said first sub-target pattern comprises one of said first and second line portions and a first portion of said crossover region and said second sub-target pattern comprises the other of said first and second line portions and a second portion of said crossover region;
determining a value for said first dimension at a point where a minimum spacing between features in said first sub-target pattern is equal to or larger than 32 nm;
generating a first set of mask data corresponding to said first sub-target pattern; and
generating a second set of mask data corresponding to said second sub-target pattern.

9. The method of claim 8, further comprising determining a value for an overlay distance between said jogged portions of said first and second sub-patterns at a point where a minimum spacing between features in said first sub-target pattern is equal to or larger than 32 nm.

10. A method, comprising:
creating an overall target pattern comprised of a plurality of features including an odd-jogged feature, wherein the each of the plurality of features are positioned above separate routing tracks, each of which are separated from an adjacent routing track by a pitch, said odd-jogged feature having a crossover region that connects first and second line portions, wherein said crossover region spans a distance corresponding to an odd number of pitches, said crossover region having a first dimension in a first direction that is parallel to a long-axis of one of said first and second line portions;
decomposing said overall target pattern into a first sub-target pattern and a second sub-target pattern, wherein said first sub-target pattern comprises one of said first and second line portions and a first portion of said crossover region and said second sub-target pattern comprises the other of said first and second line portions and a second portion of said crossover region;
determining a value for an overlay distance between said jogged portions of said first and second sub-patterns at a point where a minimum spacing between features in said first sub-target pattern is equal to or larger than 32 nm;
generating a first set of mask data corresponding to said first sub-target pattern; and
generating a second set of mask data corresponding to said second sub-target pattern.

11. A method of transferring an overall target pattern comprised of an odd-jogged feature to a layer of material using a double patterning process, said odd-jogged feature having a crossover region that connects first and second line portions, wherein said crossover region spans a distance corresponding to an odd number of pitches between the first and second line portions, said crossover region having a first dimension in a first direction that is parallel to a long-axis of one of said first and second line portions that is greater than a second dimension of each of said first and second line portions in a second direction that is transverse to said first direction, said overall target pattern comprising a first sub-target pattern and a second sub-target pattern, the method comprising;
performing a first etching process through a first mask layer having said first sub-target pattern defined therein to transfer the first sub-target pattern to said layer of material, wherein said first sub-target pattern comprises one of said first and second line portions that are separated by said odd number of pitches and a first portion of said crossover region of the odd-jogged feature; and
performing a second etching process through a second mask layer having said second sub-target pattern defined therein to transfer the second sub-target pattern to the layer of material, wherein said second sub-target pattern comprises the other of said first and second line portions that are separated by said odd number of pitches and a second portion of said crossover region of the odd-jogged feature.

12. The method of claim 11, wherein said layer of material is a hard mask layer and wherein the method further includes performing a third etching process through said layer of material having said first and second sub-target patterns defined therein to transfer said overall target pattern to another layer of material or a structure positioned under said layer of material.

* * * * *